negative level in response to the signal level applied to its input;

averaging means connected to the output of said amplifier for providing some averaging of the switching output of said amplifier;

a feedback circuit connected to said averaging means for feeding back to the input of said switching amplifier a varying signal;

an input for receiving an analog signal which is combined with the feedback signal from said feedback circuit and applied to the input of said amplifier;

a first photo emitting device connected to the output of said amplifier to be activated when the output of said amplifier is switched positive;

a second photo emitting device connected to the output of said amplifier to be activated when the output of said amplifier is switched negative;

a first photo sensitive device optically coupled to said first photo emitting device to be activated when said first photo emitting device is activated and being operable as a switching device to be either on or off;

a second photo sensitive device optically coupled to said second photo emitting device to be activated when said second photo emitting device is activated and being operable as a switching device to be either on or off;

said first photo sensitive device and said second photo sensitive device being interconnectable with a power supply to provide a pulse output which varies between a positive and negative level and whose average value corresponds to the analog signal applied to said input.

9. A switching amplifier for amplifying an analog signal having electrical isolation between the input and the output comprising:

an input for receiving an analog signal;

an amplifier having an input and an output switchable between a positive voltage level and a negative voltage level in response to the signal applied to its input;

averaging means connected to the output of said amplifier for averaging the positive and negative output levels of said amplifier;

a feedback circuit connected between the averaging means and the input of said amplifier to provide a feedback signal which is combined with the analog signal received on said input to provide the signal applied to the amplifier input;

an optical isolator comprising two photo transmitters disposed in parallel and being connected to the output of said amplifier one of which conducts when said amplifier output is positive and the other conducts when said amplifier output is negative and a pair of photo detectors optically coupled to said pair of optical transmitters and being operable as on and off switching devices in response to activation of the associated optical transmitter to provide a signal equivalent to the switching signal output of said amplifier; and, averaging means connected to said pair of photo detectors for averaging the electrical signal provided therefrom.

10. A switching amplifier as claimed in claim 9 comprising:

an oscillator connected to an input of said amplifier for providing under some operating conditions constant frequency switching of said amplifier.

11. A switching amplifier as claimed in claim 9 comprising:

a second pair of photo transmitters each connected in series with one of said two photo transmitters;

a second pair of photo detectors optically coupled to said second pair of photo transmitters and interconnected with said pair of photo detectors to provide a bridge configured output.

12. An analog signal isolator comprising:

an input for receiving an analog signal;

a hysteretic switching device having an input and an output on which are provided a series of pulses in response to the signal applied to its input;

averaging means for providing some averaging of the pulses from said hysteretic switching device;

combining means connected between said input and the input to said hysteretic switching device for combining the signals applied thereto and providing the combined signal to the input of said hysteretic switching device;

feedback means connected between said averaging means and said combining means for providing a negative feedback signal from the averaging means to an input of said combining means;

optical coupling means operably responsive to the series of pulses on the output of said hysteretic switching device for providing a series of pulses, representative of the pulses from said hysteretic switching device, which are electrically isolated from said hysteretic switching device; and, pulse to analog converting means connected to receive the series of pulses from said optical coupling means and converting them to an analog signal which is representative of but electrically isolated from the analog signal applied to said input.

13. An analog signal isolator as claimed in claim 12 comprising:

an oscillator supplying a constant frequency input to said combining means of a magnitude to cause said hysteretic switching device, at least some of the time, to switch at the oscillator frequency.

14. An analog signal isolator as claimed in claim 12 wherein said optical coupling means comprises:

a plurality of switching elements disposed in a bridge configuration to provide the pulse output.

15. An analog signal isolator as claimed in claim 14 wherein said pulse to analog converting means comprises:

averaging means for averaging the series of pulses applied thereto.

* * * * *

ISOLATION AMPLIFIER

The present invention relates to isolation amplifiers and more particularly to transformer isolated instrumentation amplifiers for electrocardiogram and other bio-potential measurements.

In the fields of data acquisition systems, process control measurements, medical and bio-potential measurements, and vital power system parameter measurement, it has been the practice to employ isolation amplifiers for accurate signal recovery along with excellent common mode noise and voltage rejection and high electrical isolation between the signal source and the processing system. The need for isolation arises when it is necessary to measure low level signals in the presence of high common mode voltages to eliminate measurement errors caused by disturbances on a common ground network, to avoid ground loops and inherent pick-up problems, to protect processing circuitry from damage from large common mode voltage levels at both input and output and provide a patient-interface when making measurements on human subjects.

In the field of isolation amplifiers it has been the practice to employ transformer coupled amplifiers and optically coupled amplifiers to obtain the required isolation between input and output terminals. The transformer coupled isolation amplifier is commonly termed the carrier isolation amplifier and generally employs at least two transformers as shown in U.S. Pat. No. 3,754,193. One transformer is used to couple a carrier signal to an isolated input modulator and to provide power for the isolated input amplifier and the other transformer is used to couple the modulated signal from the isolated input to a synchronous demodulator in the output portion of the isolated amplifier.

The optically coupled amplifiers generally employ a signal controlled light source, such as a light-emitting diode, (L.E.D.) and a pair of matched photo-detecting devices, such as photo-diodes. The accuracy of the signal transfer between the input and the output of the optically coupled amplifier is dependant upon the matching of the photo-diodes and the spectral emission of the light emitting diode to the spectral response of each of the photo-diodes. Since the optically coupled isolation amplifier has no carrier frequency coupled to the isolated input, as in the transformer coupled isolated amplifier, a DC to DC converter is required in order to provide power to the isolated front end. The DC to DC converter employs a transformer for isolating the DC voltages applied to the floating input from the DC voltage applied to the converter input.

Although such dual transformer isolated amplifiers and optically coupled amplifiers have served the purpose they have not proven entirely satisfactory under all conditions of service for the reasons that considerable difficulty has been experienced in reducing the size, complexity and weight of the amplifier's circuitry and electrical components and difficulties encountered in reducing the cost of the amplifier and in improving the reliability of the amplifier's operation.

Those concerned with the development of isolation amplifiers have long recognized the need for a simple, low cost circuit with a minimum number of components and with the same isolation accuracy and precision provided heretofor. The present invention fulfills this need.

One of the most critical problems confronting designers of isolated amplifiers has been to design a coupling circuit between the input and output of the isolation amplifier comprising a single electrical component. This problem is overcome by the present invention.

The general purpose of the invention is to provide an isolation amplifier which embraces all the advantages of similarly employed isolated amplifiers and possesses none of the aforedescribed disadvantages. To obtain this the present invention contemplates a unique common mode isolation and signal coupling circuit employing a single transformer having only two windings and an alternator or relaxation oscillator and switching arrangement whereby power supply energy and signal information are coupled through a single dual winding transformer and large physical size, high complexity and cost, and multiplicity of electrical coupling elements are avoided.

An object of the present invention is the provision of isolation in an isolated amplifier by a single electrical coupling element.

Another object is to provide an isolated amplifier having a single transformer which couples both power and signal information.

A further object of the invention is the provision of an isolated amplifier which time shares a single coupling transformer for power and signal transmission.

Still another object is to provide a loose electrode indication in an isolated amplifier having a single electrical coupling element.

Other objects and many of the intended advantages of this invention will be readily appreciated as the same becomes better understood by reference to the following detailed description, when considered in connection with the accompanying drawings in which like reference numerals designate like parts throughout the figures thereof and wherein.

Figure 1:
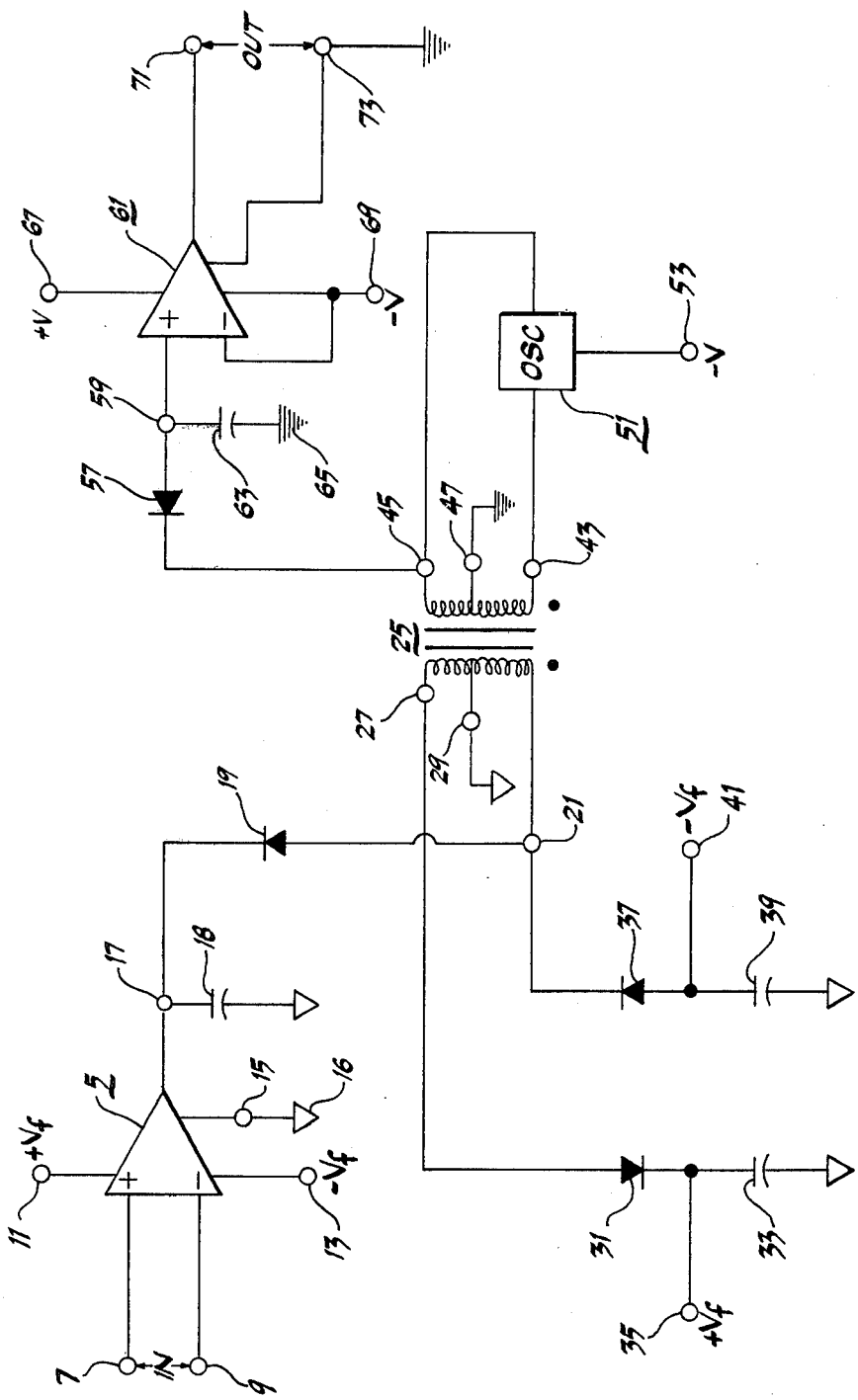
FIG. 1 shows a circuit diagram of a preferred embodiment of the invention.

Referring now to the drawings wherein like reference characters designate like or corresponding parts throughout the several figures, there is shown in FIG. 1 (which illustrates a preferred embodiment) an amplifier 5 having input terminals 7 and 9, positive and negative power supply terminals 11 and 13, respectively, a common terminal 15 connected to an input reference ground 16 and an output terminal 17. A capacitor 18 is connected between output terminal 17 and input reference ground 16 and a diode 19 has the cathode thereof connected to output terminal 17 and the anode thereof connected to terminal 21 of the primary winding of a transformer 25. The other end of the primary winding is designated as terminal 27 and the center tap of primary winding is designated as terminal 29 which in turn is connected to the reference input ground 16. Terminal 27 is connected to the anode of a diode 31, the cathode of which is connected to a capacitor 33 which in turn is connected to input reference ground 16. The junction between diode 31 and capacitor 33 is designated as terminal 35 and the source of power supply voltage $+V_f$.

Terminal 21 is further connected to the cathode of a diode 37 which in turn has the anode thereof connected to a capacitor 39 which in turn is connected to input reference ground 16. The junction between diode 37 and capacitor 39 is designated as terminal 41 and the source of power supply voltage $-V_f$. The power supply source voltages $+V_f$ and $-V_f$ provide power to power supply terminals 11 and 13, respectively, of amplifier 5.

Transformer 25 has a secondary winding connected between terminals 43 and 45 and a center tap designated as terminal 47 which in turn is connected to an output reference ground 65. The polarity of the secondary winding with respect to the primary winding of transformer 25 is such that when a current enters into the primary winding at terminal 21, a current will leave the secondary winding at terminal 43.

Terminal 43 is connected to an oscillator 51 which has a power supply terminal 53 connected to a source of direct current voltage -V. Oscillator 51 in turn is connected to terminal 45 of the secondary winding of transformer 25. Terminal 45 is further connected to the cathode of a diode 57 which has the anode thereof connected to the positive input terminal 59 of an amplifier 61. Terminal 59 further has a capacitor 63 connected therefrom to output reference ground 65. Amplifier 61 has a power supply terminal 67 to which is connected a source of direct current voltage +V, and a power supply terminal 69 which is connected to a source of direct current voltage -V along with the negative input terminal. Amplifier 61 has a pair of output terminals 71 and 73 of which terminal 73 is connected to output reference ground 65.

Figure 2:
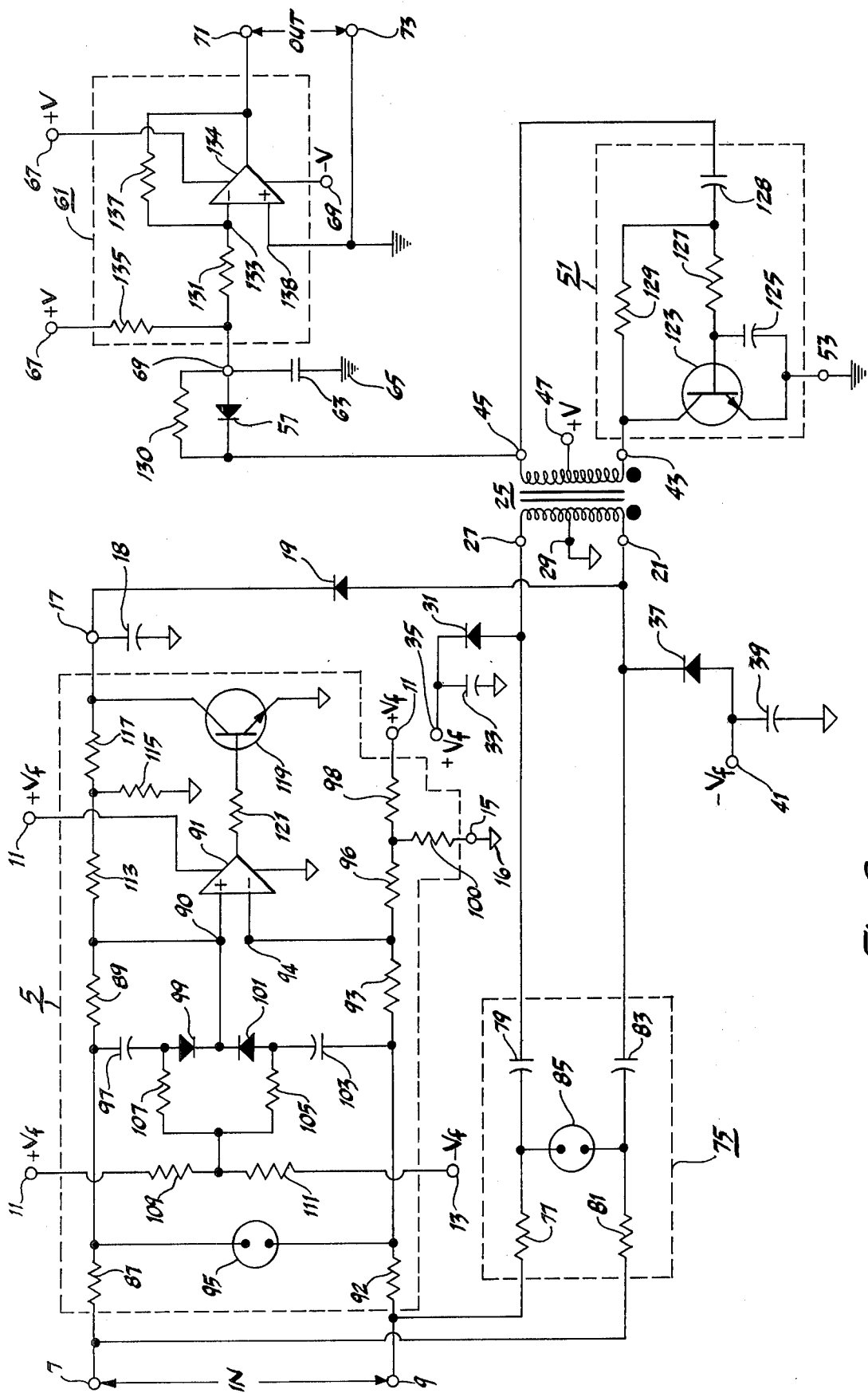
FIG. 2 illustrates a detailed circuit diagram of the circuit of FIG. 1 including a circuit configuration for electrode disconnect indication.

Turning now to FIG. 2, there is further illustrated a coupling circuit 75 which is connected to the primary winding of transformer 25. Within coupling circuit 75 a resistor 77 is connected in series with a capacitor 79 which in turn is connected to terminal 27 of the primary winding of transformer 25. Similarly a resistor 81 is connected in series with a capacitor 83 which in turn is connected to terminal 21 of the primary winding of transformer 25. The other end of resistor 77 is connected to input terminal 9 of amplifier 5 and the other end of resistor 81 is connected to input terminal 7 of amplifier 5. A neon lamp 85 is connected between the junction of resistor 77 and capacitor 79 and the junction of resistor 81 and capacitor 83.

Within amplifier 5 a resistor 87 is connected from input terminal 7 to a resistor 89 which in turn is connected to positive input terminal 90 of a differential amplifier 91. A resistor 92 is connected from input terminal 9 to a resistor 93 which in turn is connected to negative input terminal 94 of amplifier 91. A neon lamp 95 is connected between the junctions of resistors 87 and 89 and 92 and 93, respectively. A capacitor 97 is connected from the junction of resistors 87 and 89 to the anode of a diode 99 which in turn has the cathode thereof connected to the cathode of a diode 101. The anode of diode 101 is connected to a capacitor 103 which in turn is connected to the junction of resistors 92 and 93. The junction of diode 101 and capacitor 103 is connected to a resistor 105 which in turn is connected to a resistor 107 being connected in turn to the junction of capacitor 97 and diode 99. The junction of resistors 105 and 107 is connected to a resistor 109 which in turn is connected to a source of direct current supply voltage $+V_f$ designated as terminal 11 of amplifier 5. A resistor 111 also is connected between the junction of resistors 105 and 107 and a source of direct current supply voltage $-V_f$ designated as terminal 13 of amplifier 5.

A resistor 113 is connected from input terminal 90 of amplifier 91 to a resistor 115 which in turn is connected to input reference ground 16. The junction of resistors 113 and 115 is connected to resistor 117 which in turn is connected to output terminal 17 of amplifier 5. An npn transistor 119 has the collector thereof connected to output terminal 17, the emitter connected to input reference ground 16 and the base connected through a resistor 121 to the output of amplifier 91.

Oscillator 51 includes an npn transistor 123 which has the collector thereof connected to terminal 43, the base connected to the junction of a capacitor 125 and a resistor 127, and the emitter connected to the other end of capacitor 125 the junction being designated as terminal 53. The other end of resistor 127 is connected to the junction of a capacitor 128 and a resistor 129, the other end of resistor 129 being connected to terminal 43 and the other end of capacitor 128 being connected to terminal 48 of transformer 25.

In FIG. 2 center tap terminal 47 of the secondary winding of transformer 25 is illustrated as being connected to a source of direct current voltage +V instead of output reference ground shown in FIG. 1. Similarly terminal 53 of oscillator 51 is shown in as being connected to output reference ground 65. The difference in connections between FIG. 2 and FIG. 1 illustrates the choice to the designer for the selection of reference and power supply voltage points within the circuit. It should be further noted that a negative voltage may be used by appropriately changing diode polarity and transistor type, well known to electronic circuit designers.

The circuit of FIG. 2 further has a resistor 130 connected across diode 57, the function of which will be explained hereinbelow.

Amplifier 61 includes a resistor 131 which is connected from terminal 69 to a negative input 133 of a differential amplifier 134. A resistor 135 may be connected from terminal 69 to a source direct current voltage +V designated as a terminal 67. Input terminal 133 of amplifier 134 is further connected to a resistor 137 which in turn is connected to the output of amplifier 134 and to output terminal 71. Positive input terminal 138 of amplifier 134 is connected to output reference ground 65 which in turn is connected to output terminal 73. The positive and negative power supply terminals 67 and 69, respectively, of amplifier 134 are connected to +V and −V power sources, respectively.

The signal and power coupling circuits of the invention can best be described by reference to FIG. 1. Transformer 25 is readily observed to be the sole electrical element coupling signals from input amplifier 5 to output amplifier 61 and isolating input reference ground 16 from output reference ground 65.

Oscillator 51 functionally can be described as an alternator which alternately presents or connects a source of direct current voltage and a high impedance or open circuit to the secondary winding of the transformer 25. During the time oscillator 51 presents a voltage to the secondary winding, −V is connected to terminal 43 of the secondary winding and, therefore, a voltage −V is applied from terminal 43 to center tap terminal 47 of the secondary winding. In response, a voltage of +V appears at terminal 45 with respect to center tap terminal 47. The +V voltage at terminal 45 backbiases diode 57 and, therefore, prevents any conduction of current to capacitor 63. Therefore a voltage of 2V appears across the secondary winding and is coupled through transformer 25 to produce a negative voltage at terminal 21 with respect to center tap terminal 29 of the primary transformer 25 and a positive voltage between terminal 27 and center tap terminal 29 of transformer 25. The negative voltage on terminal 21 and the positive voltage on terminal 27 with respect to center tap terminal 29 causes diodes 31 and 37 to conduct to charge capacitors 33 and 39, respectively. The charging of capacitors 33 and 39 develops $+V_f$ and $-V_f$ power supply voltages to power amplifier 5. The negative voltage on terminal 21 of the primary winding of transformer 25 causes diode 19 to be backbiased and, therefore, capacitor 18 is disconnected from terminal 21.

When oscillator 51 presents a high impedance to secondary winding of transformer 25 or substantially creates an open circuit between $-V$ and terminal 43, the energy stored in the transformer cannot change instantaneously and a voltage is developed across the windings of the transformer of opposite polarity to that previously established, which reversed polarity tends to try to keep the current flowing in the windings in the same direction as before. Therefore, terminal 45 becomes negative with respect to center tap terminal 47 causing diode 57 to conduct and similarly terminal 21 of the primary winding of transformer 25 becomes positive with respect to center tap terminal 29 causing diode 19 to conduct. The conduction of diode 19 clamps terminal 21 of primary winding of transformer 25 to the voltage across capacitor 18 which is the signal voltage amplified by amplifier 5. Consequently, the signal voltage across capacitor 18 is transmitted through the transformer to the secondary winding and a negative voltage directly proportional thereto is induced between terminal 45 and center tap 47 of the secondary winding. This negative voltage is coupled through diode 57 to capacitor 63 which in turn holds the negative voltage coupled thereto while diode 57 is back-biased. Oscillator 51 then applies a $-V$ voltage between terminal 43 and center tap 47 to start the cycle again.

The frequency of oscillation of oscillator 51 is chosen to be significantly larger than the highest frequency of the signal being transmitted between the input and the output of the isolation amplifier such that during the times that the signal is coupled from capacitor 18 through transformer 25 to capacitor 63, there is substantially negligible signal variation.

It should be pointed out that amplifier 5 can be an operational amplifier well known in the field of electrical measurement and does not necessarily have to be a differential amplifier as illustrated. Input terminal 9 could be connected to input reference ground 16 and the input applied between terminal 7 and input reference ground 16.

However, for medical applications input reference ground is generally connected to some reference point on a living subject and input terminals 7 and 9 would be connected to a specific area of the living subject to measure a bio-potential therebetween. In such an application amplifier 5 would be a differential amplifier. Similarly, amplifier 61 can be an operational amplifier.

Transformer 25 can be a toroidal transformer in which the primary winding and the secondary winding contain the same number of turns. The higher the oscillator frequency, the smaller the core and the number of turns required for transformer 25. A typical frequency for the oscillator is approximately 1 megaHz.

Directing the discussion of operation now to FIG. 2, oscillator 51 is shown as a simple single transistor relaxation oscillator. When power is applied to the center tap 47, the transistor initially turns on clamping terminal 43 to terminal 53 and, therefore, applying $+V$ voltage between center tap 47 and terminal 43 of transformer 25. This results in 2 times $+V$ volts appearing at terminal 45 maintaining diode 57 in a backbiased condition. However, resistor 130 across diode 57 allows a current to flow into capacitor 63 so that capacitor 63 can follow the positive going signals applied thereacross. The time constant established by resistor 130 and capacitor 63 is sufficient to allow capacitor 63 to follow the signal voltage. The ratio of resistor 137 to 131 determines the gain of amplifier 134.

Coupling circuit 75 couples through capacitors 83 and 79 and resistors 81 and 77, respectively, the alternating signal across the primary of transformer 25 to the input terminal 7 and 9. Capacitors 79 and 83 couple the alternating signal but prevent any DC from being coupled therethrough. Neon lamp 85 provides a form of limiting or clamping device to limit the voltage appearing thereacross from external sources. Resistors 81 and 77 are sufficiently large in magnitude so as to provide a small AC current across a low impedance that may be connected between terminals 7 and 9. When a measuring electrode becomes disengaged from terminals 7 and 9 the current flowing through resistors 81 and 77 is then directed through resistors 87 and 92 and alternately through capacitors 103 and 97 through diodes 99 and 101, to cause input terminal 90 of amplifier 91 to be biased into a positive direction lock-up, thereby providing a positive full-scale lock-up as an electrode disconnect indication. Resistors 107 and 105 are connected to a voltage at the junction of resistors 109 and 111 so as to allow capacitors 97 and 103 to discharge between cycles and thereby allow sufficient current through diodes 101 and 99 to maintain amplifier 91 in lock-up. Neon lamp 85 provides a voltage limitation or break down element to prevent the voltage between terminals 9 and 7 from developing to an excessive amount.

It should be noted that the input circuitry between terminals 7 and 9 and terminals 90 and 94 of amplifier 91 is alternating current linear, thereby preventing direct polarization of biopotential electrodes which may be connected to input terminal 7 and 9. If the electrodes were utilized for electrocardiogram monitoring, direct current polarization would cause loss of this monitoring ability until depolarization occurs. Therefore, if there is a large magnitude of radio frequency from diathermy apparatus or other medical treating apparatus, this high level radio frequency would not create any direct current in the input circuitry of the isolation amplifier nor polarize electrodes.

Amplifier 91 and resistors 89 and 113, and 93 and 96 (which resistors are all equal precision resistors) form a unity gain differential amplifier. Resistors 98 and 100 set the reference bias of the amplifier such that with a zero input signal, transistor 119 clamps the transformer primary winding through diode 19 to an amplitude set to be approximately $+V_f$ arbitrarily. R17 and R15 set the gain of the amplifier.

It now should be apparent that the present invention provides a circuit arrangement which may be employed in conjunction with an isolated amplifier for coupling both power and signal information through a single isolation transformer in addition to providing an open electrode indication for the input terminals.

Although particular components, etc., have been discussed in connection with specific embodiments of an isolated amplifier constructed in accordance with the teachings of the present invention, others may be utilized. Furthermore, it will be understood that although an exemplary embodiment of the present invention has been disclosed and discussed, other applications and circuit arrangements are possible and that the embodiments disclosed may be subjected to various changes, modifications and substitutions without necessarily departing from the spirit of the invention.

What is claimed is:

1. An isolation amplifier comprising:
   input amplifier means for amplifying an electrical signal, said input amplifier means having input, output, power supply and input reference ground terminals, the input terminals being adapted to receive an input signal;
   output amplifier means for amplifying an electrical signal, said output amplifier means having input, output and output reference ground terminals, said reference ground terminals of said output amplifier means being isolated and independent from said input amplifier means input reference ground terminals;
   a transformer having single primary and single secondary windings;
   alternator means connected to said secondary winding for alternately presenting a voltage and a high impedance to said secondary winding;
   first switching means connected between said primary winding and the output terminal of said input amplifier means for connecting said output terminal of said input amplifier means to said primary winding when said alternator means presents a high impedance to said secondary winding and for disconnecting said output terminal of said input amplifier means from said primary winding when said alternator means presents a voltage to said secondary winding, whereby a signal appearing on said output terminal of said input amplifier means in response to a signal applied to said input terminals is alternately connected to said primary winding; and
   second switching means connected between said secondary winding and the input terminal of said output amplifier means for connecting said input terminal of said input amplifier means to said secondary winding when said alternator means presents a high impedance to said secondary winding and disconnecting said input terminal of said output amplifier means from said secondary winding when said alternator means presents a voltage to said winding whereby the signal appearing at said output terminal of said input amplifier is alternately coupled through said transformer to the input terminal of said output amplifier providing signal amplification from said input amplifier means to said output of said output means while isolating said input amplifier means input reference ground from said output amplifier means output reference ground.

2. The isolation described in claim 1 further including third switching means connected to said primary winding for connecting said primary winding to electrical storage means when said alternator means presents a voltage to said secondary winding; and
   electrical storage means connected to said third switching means for storing electrical energy transferred from said primary winding to said third switching means when said third switching means connects said primary winding to said electrical storage means whereby a source of direct current power is formed to bias said input amplifier means.

3. The isolation amplifier described in claim 1 wherein said first switching means and said second switching means and said third switching means are unidirectional conducting devices.

4. The isolation amplifier described in claim 1 wherein said input amplifier means has a pair of input terminals and includes a differential amplifier having a positive and a negative input terminal, further including a circuit for indicating a high impedance between the input terminals of said input amplifier means, comprising:
   first, second, third and fourth resistors, said first and second resistors being connected in series between one input terminal of said input amplifier means and the positive input terminal of said differential amplifier and said second and third resistors being connected in series between the other input terminal of said input amplifier means and the negative input terminal of said differential amplifier;
   impedance means for coupling an alternating signal from said primary winding to the input terminals of said input amplifier means;
   a pair of diodes, each having an anode and cathode, the cathodes thereof being connected together and connected to the positive input terminal of said differential amplifier;
   first and second coupling capacitors, said first coupling capacitor being connected between the junction of said first and second resistors and said anode of one of said pair of diodes, said second coupling capacitor being connected between the junction of said third and fourth resistors and said anode of the other of said pair of diodes whereby when said input terminals of said input amplifier means have a high impedance therebetween a signal in response to said alternating signal from said primary winding is generated and coupled through said first and second resistors and said first and second coupling capacitors and alternately through said pair of diodes to bias said differential amplifier in a positive lock-up condition as an indication of a disconnected electrode high impedance between said input terminals of said input amplifier means; and
   resistance means connected to each of the anodes of said pair of diodes and adapted and arranged to be connected to a direct current voltage whereby accumulated charge on said first and second coupling capacitor is discharged.

* * * * *